(12) United States Patent
Sahota et al.

(10) Patent No.: US 6,426,297 B1
(45) Date of Patent: Jul. 30, 2002

(54) DIFFERENTIAL PRESSURE CHEMICAL-MECHANICAL POLISHING IN INTEGRATED CIRCUIT INTERCONNECTS

(75) Inventors: Kashmir S. Sahota, Fremont; Krishnashree Achuthan, San Ramon; Sergey D. Lopatin, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/905,296

(22) Filed: Jul. 13, 2001

(51) Int. Cl.[7] ............... H01L 21/382; H01L 21/461
(52) U.S. Cl. ............... 438/692; 438/633; 438/687; 438/690
(58) Field of Search ............... 438/690, 691, 438/692, 693, 626, 629, 631, 633, 627, 628, 687, 688

(56) References Cited

U.S. PATENT DOCUMENTS 5,800,248 A * 9/1998 Pant et al. ............... 451/41
6,179,956 B1 * 1/2001 Nagahara et al. ............ 156/345

OTHER PUBLICATIONS

Grayson et al, "Monitoring Key CMP Process Parameters to improve manufacturing productivity", Semconductor Manufacturing Conference Proceedings, International Symposium, Oct. 1997, pp. 107–113.*

* cited by examiner

Primary Examiner—Tuan H. Nguyen
Assistant Examiner—Thanhha Pham
(74) Attorney, Agent, or Firm—Mikio Ishimaru

(57) ABSTRACT

A method is provided for manufacturing an integrated circuit having a semiconductor substrate with a semiconductor device. A dielectric layer is formed on the semiconductor wafer and an opening is formed in the dielectric layer. A barrier layer is deposited to line the opening and a conductor core is deposited to fill the channel opening over the barrier layer. The semiconductor wafer is then subjected to chemical-mechanical polishing using a differential pressure between the center of the semiconductor wafer and its periphery.

10 Claims, 2 Drawing Sheets

DIFFERENTIAL PRESSURE CHEMICAL-MECHANICAL POLISHING IN INTEGRATED CIRCUIT INTERCONNECTS

TECHNICAL FIELD

The present invention relates generally to semiconductor technology and more specifically to chemical-mechanical polishing in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of materials such as tantalum (Ta), titanium (Ti), tungsten (W), and their nitrides which are good barrier materials and have good adhesion to the dielectric materials.

Good barrier materials provide resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum, titanium, or tungsten are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and the "single" damascene process is completed. When additional layers of material are to be deposited for the dual damascene process, the capping layer also functions as an etch stop layer for a via formation step.

The via formation step of the dual damascene process continues with the deposition of a via dielectric layer over the first channels, the first channel dielectric layer, and the capping or via stop layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to simultaneously form the vias and the second channels. When a layer is placed over the second channels as a final layer, it is called a "capping" layer and the "dual" damascene process is completed.

Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

One of the major problem areas in this technology relates to the CMP process where a rotary pad is used with a chemical polishing solution to planarize the semiconductor wafer. After deposition of the barrier layer and the seed layer, the electroplating process deposits conductor core material which can have a random thickness variation of up to two percent. The conventional rotary polishers polish the conductor material slower at the edges of the semiconductor wafer than at the center of the semiconductor wafer. Thus, in order to remove all of the conductor material above the barrier layer, over-polishing is required at the center of the semiconductor wafer. This results in a non-planar semiconductor wafer and rejected or marginal integrated circuits at the center of the semiconductor wafer.

As wafers increase in size, the non-planarity of the semiconductor wafer becomes a greater and greater problem.

A solution to this problem has been long sought but has long eluded those skilled in the art.

DISCLOSURE OF THE INVENTION

The present invention provides a method for manufacturing an integrated circuit having a semiconductor substrate with a semiconductor device. A dielectric layer is formed on the semiconductor substrate and an opening is formed in the dielectric layer. A barrier layer is deposited to line the opening and conductor core is deposited to fill the channel opening over the barrier layer. The semiconductor wafer is subjected to chemical-mechanical polishing using a differential pressure from the center of the semiconductor wafer to the outer edge causing the semiconductor wafer to be planar. As a result, improved channel thickness control is achieved and the conductivity of the channels is improved.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
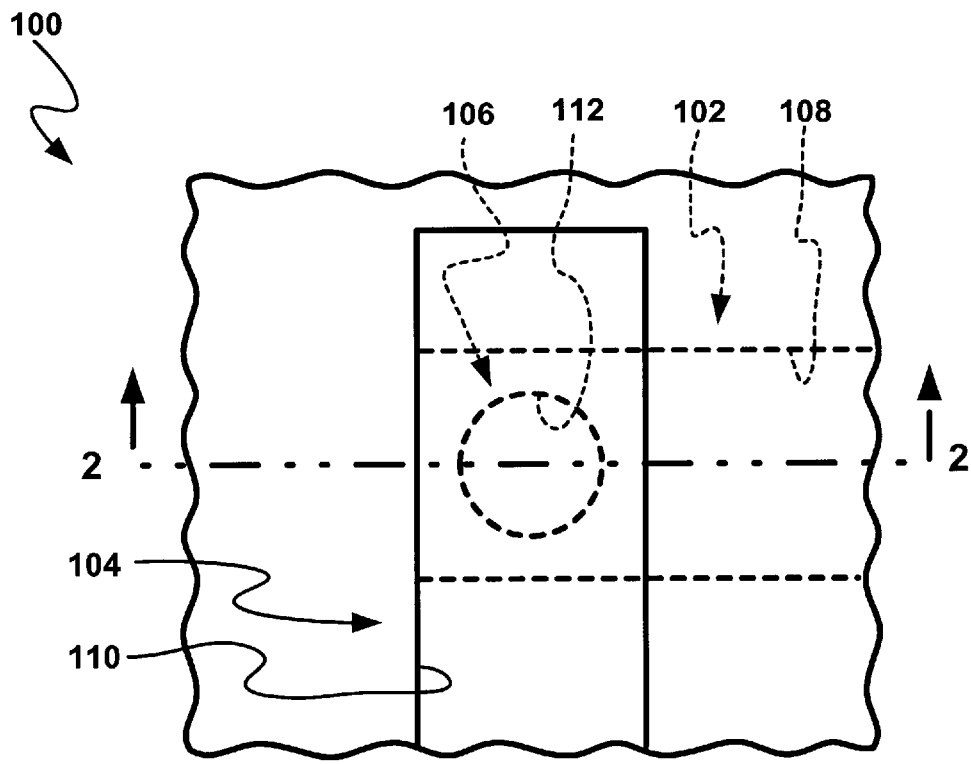
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined and the thickness of the channels and dielectric layers are measured in the vertical direction. Terms, such as "on", "above", "below", "side" (as in "sidewall"), "higher", "lower", "over", and "under", are defined with respect to the horizontal plane.

Figure 2:
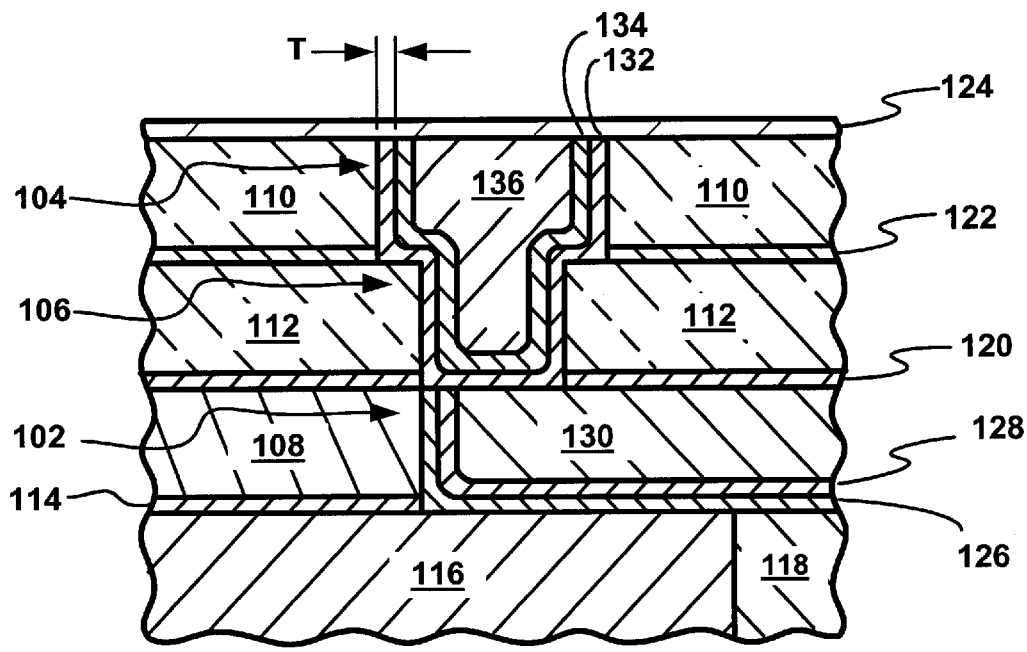
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. As shown, conventional barrier layers 126 and 132 have a thickness "T" since they are used as a chemical-mechanical polishing (CMP) stop for the CMP of the conductor cores 130 and 136. The thickness "T" is required because it is difficult to stop at the conductor core to barrier layer interface and it is expected that some of the barrier layer will be eroded before the CMP process is able to stop.

The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

Figure 3:
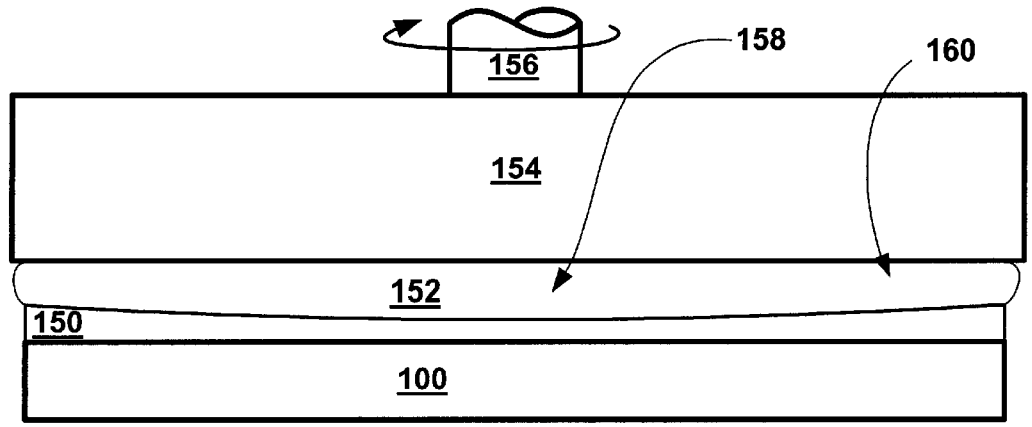
FIG. 3 (PRIOR ART) shows a step in the chemical-mechanical polishing process which depicts the non-planarity of a prior art semiconductor wafer.

Referring now to FIG. 3 (PRIOR ART), therein is shown a step in the CMP process of the semiconductor wafer 100. The semiconductor devices (not shown), the device dielectric layer 116, the first channel stop layer 114, the first channel dielectric layer 108, the barrier layer 126, the seed layer 128, and the conductor core 136 have all been deposited and are generally referred to as a semiconductor wafer layer 150.

A CMP slurry solution 152 has been dispensed and is forced against the semiconductor wafer layer 150 by a polishing pad 154, which rotates on a shaft 156. The rotation of the pad 154 and of the CMP solution 152 causes an over-polishing of conductor core material in the region 158 near the center of the semiconductor wafer 100 and less polishing near the region 160 at the outer perimeter. The vertical dimension of the overpolishing is exaggerated.

Figure 4:
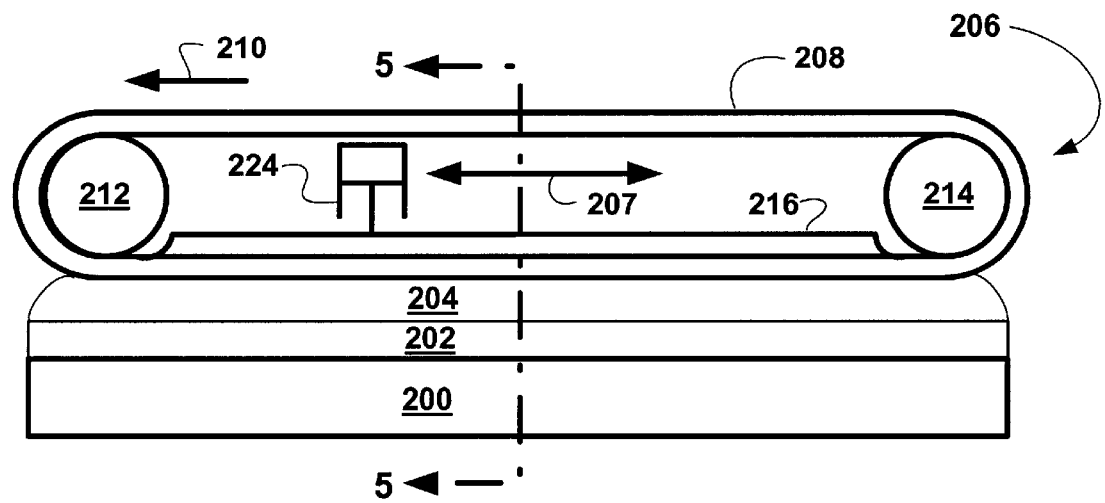
FIG. 4 shows a side view of a step in the chemical-mechanical polishing process and depicts the planarity of a semiconductor wafer made in accordance with the present invention.

Referring now to FIG. 4, therein is shown a side view of a step in the CMP process in accordance with the present invention. The semiconductor devices (not shown), a device dielectric layer, a first channel stop layer, a first channel dielectric layer, a barrier layer, a seed layer, and a conductor core have all been deposited and are generally referred to as a semiconductor wafer layer 202.

The CMP process includes dispensing of a CMP slurry solution 204, which is forced into contact with the semiconductor wafer layer 202 by a linear polisher 206.

The linear polisher 206 includes a linear pad belt 208, which moves in the direction 210 on a pair of rollers 212 and 214. The linear pad belt 208 is kept flat by a pressure plate 216, which is held in place by a number of holding mechanisms, such as a series of air cylinders, of which one air cylinder 224 is shown. The linear polisher 206 is also capable of being reciprocated along the direction of the linear pad belt 208 in a direction 207.

Figure 5:
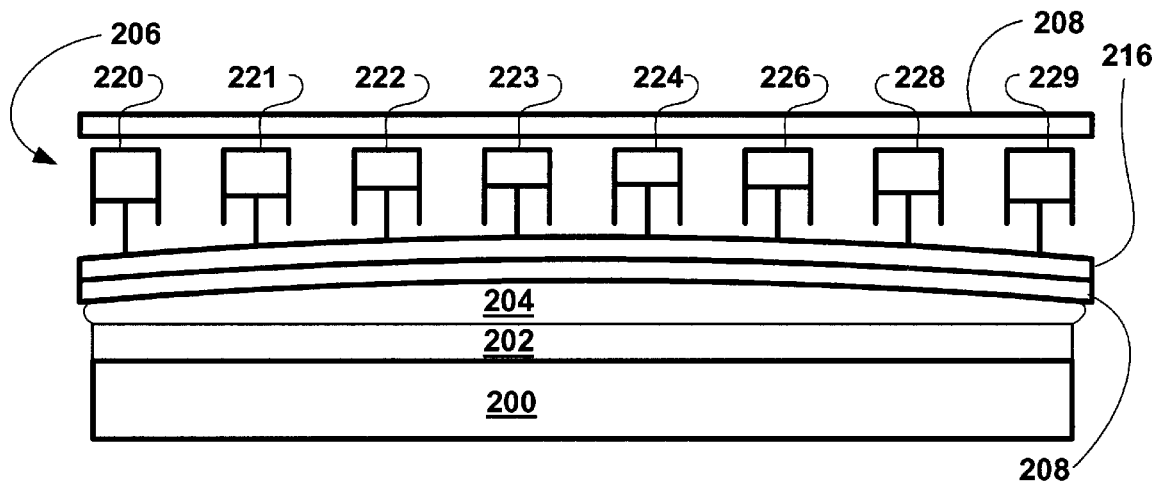
FIG. 5 shows a cross-section of FIG. 4 taken along line 5—5 with a schematic representation of one mode of practicing the present invention.

Referring now to FIG. 5, therein is shown a cross-section of FIG. 4 taken along line 5—5 with a schematic representation of one mode of practicing the present invention. The linear polisher 206 is shown with a series of air cylinders 220–229 disposed within the linear pad belt 208 and applying varying degrees of pressure to the pressure plate 216. The setup, supports, and connections are not shown but would be evident to those having ordinary skill in the mechanical arts.

By applying air pressure which decreases from air cylinder 220 to air cylinder 223, and then starts to increase from air cylinder 224 to air cylinder 229, a differential pressure can be applied to the pressure plate 216 so as to assure a planar surface on the semiconductor wafer layer 202 which is equal to or under two percent. The present invention is referred to as "differential CMP" is because of the differential force from one portion of the semiconductor wafer 200 to another.

In one embodiment, it has been determined that a pressure applied to the semiconductor wafer of between 0.5 to 1.5 psi greater at the peripheral region of the semiconductor wafer 200 proximate the air cylinders 220 and 229 than in the regions proximate the center of the semiconductor wafer 200 near air cylinders 223 and 224 will produce a semiconductor wafer layer 202 which is not subject to uneven CMP and to channel thickness control problems.

As would be evident, subsequent CMP operations can use the same differential CMP process of the present invention.

In the best mode, the barrier layers are of materials such as tantalum (Ta), titanium (Ti), tungsten (W), nitrides thereof, and a combination thereof. The seed layers and conductor cores are of materials such as copper (Cu), copper-base alloys, aluminum (Al), aluminum-base alloys, gold (Au), gold-base alloys, silver (Ag), silver-base alloys, and a combination thereof. The dielectric layers are of silicon dioxide (SiO,) or a low dielectric material such as HSQ, Flare, silica low-k (SiLK), p-SiLK, etc. The stop layers are of materials such as silicon nitride (SiN) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

providing a semiconductor wafer having a center and a periphery, the semiconductor wafer having a semiconductor device provided thereon;

forming a dielectric layer on the semiconductor wafer;

forming an opening in the dielectric layer;

depositing a barrier layer to line the opening;

depositing a conductor core over the barrier layer to fill the opening and connect to the semiconductor device; and chemical-mechanical polishing the conductor core on the semiconductor wafer using a differential pressure between the center of the semiconductor wafer and the periphery of the semiconductor wafer, the chemical-mechanical polishing uses a reciprocating linear polisher.

2. The method of manufacturing an integrated circuit as claimed in claim 1 wherein chemical-mechanical polishing uses air pressure to apply differential pressure increasing from the center of the semiconductor wafer to the periphery of the semiconductor wafer.

3. The method of manufacturing an integrated circuit as claimed in claim 1 wherein depositing the conductor core deposits a material selected from a group consisting of copper, aluminum, gold, silver, a compound thereof, and a combination thereof.

4. The method of manufacturing an integrated circuit as claimed in claim 1 wherein depositing the barrier layer deposits a material selected from a group consisting of tantalum, titanium, tungsten, a compound thereof, and a combination thereof.

5. The method of manufacturing an integrated circuit as claimed in claim 1 wherein chemical-mechanical polishing uses differential pressure increasing from the center of the semiconductor wafer to the periphery of the semiconductor wafer.

6. A method of manufacturing an integrated circuit comprising:

providing a semiconductor wafer having a center and a periphery, the semiconductor wafer having a semiconductor device provided thereon;

forming a device layer on the semiconductor wafer;

forming a channel layer on the device layer;

forming a channel opening in the channel layer;

depositing a barrier layer to line the channel opening;

depositing a seed layer on the barrier layer;

depositing a conductor core to fill the channel opening and connect to the semiconductor device; and chemical-mechanical polishing the conductor core on the semiconductor wafer using a differential pressure between the center of the semiconductor wafer and the periphery of the semiconductor wafer, the chemical-mechanical polishing uses a reciprocating linear pad belt polisher.

7. The method of manufacturing an integrated circuit as claimed in claim 6 wherein chemical-mechanical polishing uses air pressure applied through air cylinders to apply differential pressure increasing from the center of the semiconductor wafer to the periphery of the semiconductor wafer.

8. The method of manufacturing an integrated circuit as claimed in claim 6 wherein depositing the seed layer and the conductor core deposits materials selected from a group consisting of copper, gold, silver, a compound thereof, and a combination thereof.

9. The method of manufacturing an integrated circuit as claimed in claim 6 wherein depositing the barrier layer uses a material selected from a group consisting of tantalum, titanium, tungsten, a compound thereof, and a combination thereof.

10. The method of manufacturing an integrated circuit as claimed in claim 6 wherein chemical-mechanical polishing uses differential pressure increasing from the center of the semiconductor wafer to the periphery of the semiconductor wafer wherein the pressure at the outer edge is from 0.5 to 1.5 psi higher than the pressure at the center.

* * * * *